US008481379B2

(12) United States Patent
Liang et al.

(10) Patent No.: US 8,481,379 B2
(45) Date of Patent: Jul. 9, 2013

(54) METHOD FOR MANUFACTURING FIN FIELD-EFFECT TRANSISTOR

(75) Inventors: Qingqing Liang, Lagrangeville, NY (US); Huilong Zhu, Poughkeepsie, NY (US); Huicai Zhong, San Jose, CA (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 88 days.

(21) Appl. No.: 13/375,976

(22) PCT Filed: Aug. 10, 2011

(86) PCT No.: PCT/CN2011/078196
§ 371 (c)(1),
(2), (4) Date: Dec. 2, 2011

(87) PCT Pub. No.: WO2012/162943
PCT Pub. Date: Dec. 6, 2012

(65) Prior Publication Data
US 2012/0309139 A1    Dec. 6, 2012

(30) Foreign Application Priority Data
May 31, 2011 (CN) .......................... 2011 1 0144894

(51) Int. Cl.
*H01L 21/338*        (2006.01)
(52) U.S. Cl.
USPC .................... 438/183; 438/300; 257/E21.454
(58) Field of Classification Search
USPC ................... 438/183, 296, 300; 257/E21.454
See application file for complete search history.

(56) References Cited

U.S. PATENT DOCUMENTS

| 6,864,164 | B1 * | 3/2005 | Dakshina-Murthy et al. ............ 438/585 |
| 7,186,599 | B2 | 3/2007 | Ahmed et al. |
| 7,211,864 | B2 * | 5/2007 | Seliskar ................ 257/347 |
| 7,902,029 | B2 | 3/2011 | Grupp et al. |
| 2005/0153485 | A1 | 7/2005 | Ahmed et al. |
| 2006/0084232 | A1 | 4/2006 | Grupp et al. |
| 2006/0175669 | A1 | 8/2006 | Kim et al. |
| 2011/0124170 | A1 | 5/2011 | Grupp et al. |

FOREIGN PATENT DOCUMENTS

CN          1902741 A          1/2007

OTHER PUBLICATIONS

Int'l Search Report (Mar. 1, 2012).
Written Opinion (Mar. 1, 2012).

* cited by examiner

*Primary Examiner* — William D Coleman
(74) *Attorney, Agent, or Firm* — Goodwin Procter LLP

(57) ABSTRACT

An embodiment of the present invention discloses a method for manufacturing a FinFET, when a fin is formed, a dummy gate across the fin is formed on the fin, a source/drain opening is formed in both the cover layer and the first dielectric layer at both sides of the dummy gate, the source/drain opening is at both sides of the fin covered by the dummy gate and is an opening region surrounded by the cover layer and the first dielectric layer around it. In the formation of a source/drain region in the source/drain opening, stress is generated due to lattice mismatching, and applied to the channel due to the limitation by the source/drain opening in the first dielectric layer, thereby increasing the carrier mobility of the device, and improving the performance of the device.

17 Claims, 14 Drawing Sheets

METHOD FOR MANUFACTURING FIN FIELD-EFFECT TRANSISTOR

This application is a national phase application of, and claims priority to, PCT Application No. PCT/CN2011/078196, filed on Aug. 10, 2011, entitled "METHOD FOR MANUFACTURING FIN FIELD-EFFECT TRANSISTOR," which claimed priority to Chinese Patent Application No. 201110144894.8, filed on May 31, 2011. Both the PCT application and the Chinese application are incorporated herein by reference in their entireties.

FIELD OF THE INVENTION

The present invention relates to the field of semiconductor manufacturing technology, and in particular to a method for manufacturing a Fin Field-Effect Transistor (FinFET).

BACKGROUND OF THE INVENTION

With high integration in semiconductor devices, the channel length of a Metal-Oxide-Semiconductor Field-Effect Transistor (MOSFET) becomes increasingly shorter. Those effects that are negligible in a long-channel model of MOSFET become more significant, or even a major factor affecting the performance of the device. This phenomenon is called a short-channel effect. The short-channel effect may degrade electrical performance of the device, causing problems such as decreased threshold voltage of the gate, increased power consumption and reduced signal-to-noise ratio.

In order to control the short-channel effect, improvements have been made to conventional transistor devices in some aspects. However, with the channel size continuing to shrink, the improvements can no longer resolve the short-channel effect when it becomes increasingly significant.

Therefore, in order to solve the problem of short-channel effect, a three-dimensional device structure of Fin Field-Effect Transistor (FinFET) has been proposed. A FinFET is a transistor with a fin-shaped channel structure, in which some surfaces of a thin tin act as the channel, allowing enhanced operating current, and thus avoiding the short-channel effect in a conventional transistor.

As shown in FIG. 1, a structural diagram of an existing FinFET, comprising: a fin 100; a gate 102 on the upper surface and the sides of the fin: and a source/drain region 104 at two ends of the fin. The FinFET has the advantage of increased drive current, without taking much area, making it a promising competitor for the next generation Ultra-Large Scale Integration. Due to the three-dimensional device structure of the FinFET, in comparison with conventional planar technology, a new form of stress applying is required.

Therefore, it is desired to provide a method for manufacturing a FinFET, which can improve the effect of stress in the device and further improve the performance of the device.

SUMMARY OF THE INVENTION

The embodiments of the present invention provide a method for manufacturing a FinFET, which can improve the effect of stress in the active region and improve the performance of the device.

To achieve the object above, the embodiments of the present invention provide a technical solution below.

A method for manufacturing a FinFET, comprising:
providing a substrate;
forming a fin on the substrate, and forming a first dielectric layer on the substrate outside the fin;
forming a dummy gate across the fin on both the first dielectric layer and the fin, and forming a cover layer on the fin and the first dielectric layer outside the dummy gate, wherein upper surfaces of both the cover layer and the dummy gate are in the same plane;
removing portions of both the cover layer and the first dielectric layer at both sides of the dummy gate, so as to form a source/drain opening such that the fin at both sides of the dummy gate is exposed in the source/drain opening;
filling the source/drain opening to form a source/drain region comprising the fin at both sides of the dummy gate;
removing part of the dummy gate and removing the first dielectric layer under the dummy gate, so as to form a gate region opening such that the fin under the dummy gate is exposed in the gate region opening; and
filling the gate region opening to form a gate covering the fin.

Optionally, the step for forming a source/drain region comprises: filling the source/drain opening by epitaxial growth to form a source/drain region comprising the fin at both sides of the dummy gate.

Optionally, after the step for forming a dummy gate, the method further comprises: forming a spacer on sidewalls of the dummy gate.

Optionally, edges of both the gate and the source/drain region are not aligned in the direction along the fin.

Optionally, the cover layer comprises a second dielectric layer and a third dielectric layer on the second dielectric layer, and the second dielectric layer and the third dielectric layer are made of different dielectrics.

Optionally, the third dielectric layer, the third dielectric layer, the second dielectric layer and the spacer are made of different dielectrics, respectively.

Optionally, after the step for forming a fin, the method further comprises: forming a cap layer on the fin, and further comprises:
forming a dummy gate across the fin on the first dielectric layer and the cap layer, and forming a cover layer on the first dielectric layer and the cap layer outside the dummy gate, wherein upper surfaces of both the cover layer and the dummy gate are in the same plane; and
removing the first dielectric layer, the cover layer and the cap layer at both sides of the dummy gate to form a source/drain opening.

Optionally, an upper surface of the first dielectric layer is flushed with that of the fin.

In comparison with the prior art, the technical solution discussed above have the advantages below.

According to the FinFET and the method for manufacturing a FinFET of the embodiments of the present invention, when a fin is formed, a dummy gate across the fin is formed on the fin, a source/drain opening is formed in both the cover layer and the first dielectric layer at both sides of the dummy gate, the source/drain opening is at both sides of the fin covered by the dummy gate and is an opening region surrounded by the cover layer and the first dielectric layer around it. In the formation of a source/drain region in the source/drain opening, stress is generated due to lattice mismatching, and applied to the channel due to the limitation by the source/drain opening in the first dielectric layer, thereby increasing the carrier mobility of the device, and improving the performance of the device.

BRIEF DESCRIPTION OF THE DRAWINGS

The above and other objects, features and advantages of the present invention will become more apparent when read in conjunction with the accompanying drawings, in which the same reference numerals denote the same components. The figures are not drawn to scale, in order to not unnecessarily obscure the essence of the present invention.

DETAILED DESCRIPTION OF THE INVENTION

For a better understanding of the objects,. features and advantages above of the present invention, the embodiments of the present invention will be described in details hereinafter with reference to the accompanying drawings.

In the following description, numerous specific details are set forth, in order to provide a thorough understanding of the present invention. It will be apparent to one skilled in the art that the present invention may be practiced without these specific details, and that equivalents to the present invention may be obtained without deviation from the essence of the present invention. Hence the present invention is not limited to the embodiments disclosed herein.

Moreover, the present invention is described in details in conjunction with the accompanying drawings. For illustrative purposes, the cross-sectional views of the device structures are locally and disproportionally enlarged, and do not limit the scope of protection of the present invention. Furthermore, in practice, three-dimensional sizes including length, width and depth should be included.

Figure 1:
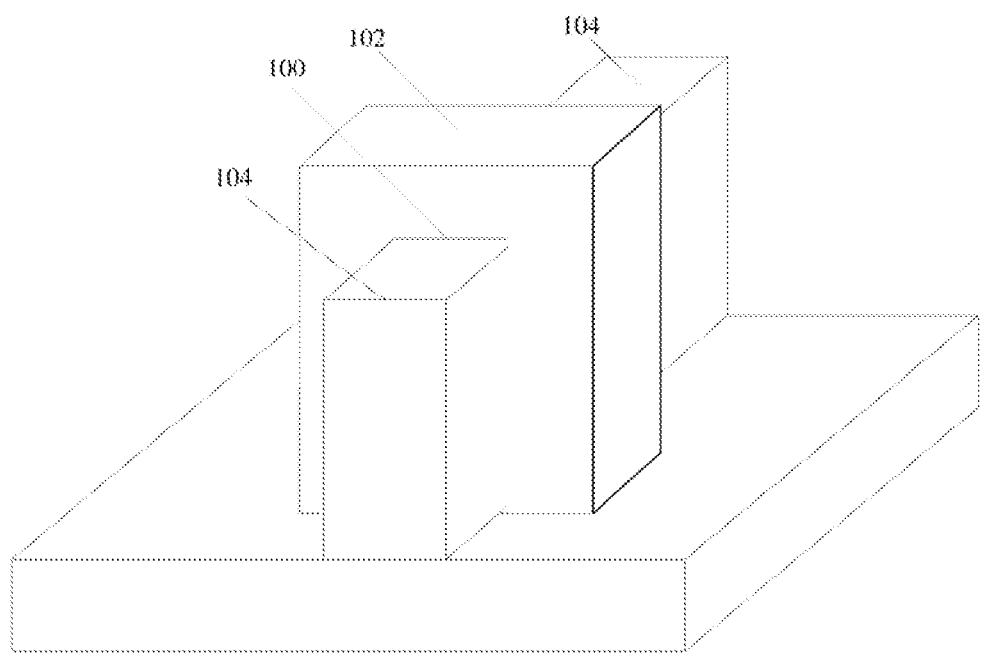
FIG. 1 is a structural diagram of a FinFET in the prior art.
Figure 2:
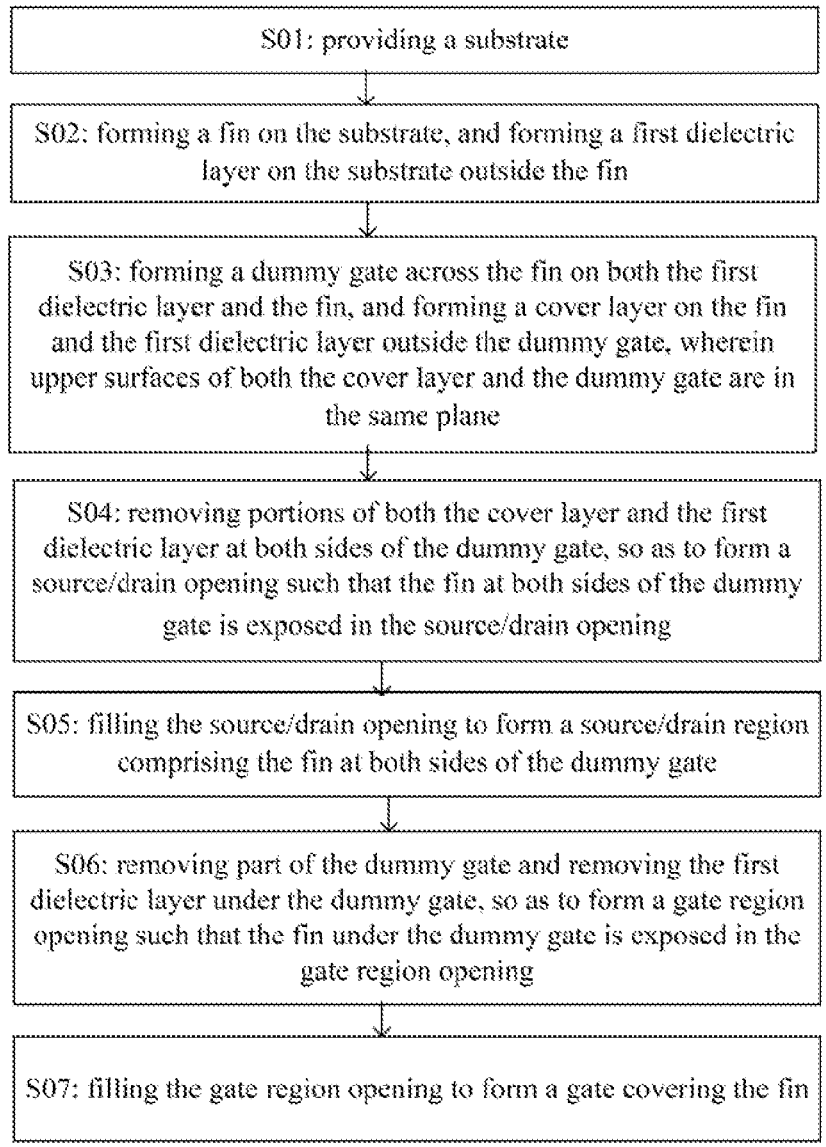
FIG. 2 is a flow chart of a method for manufacturing a FinFET according to an embodiment of the present invention.

In order to solve the problem of inaccurate alignment of contact plugs in FinFET manufacturing, the present invention provides a method for manufacturing a FinFET, as shown in FIG. 2, a flow chart of a method for manufacturing a FinFET according to the present invention. The method of the present invention will be described in details in conjunction with FIG. 3 to FIG. 26. It is noted that the embodiments disclosed herein are preferred technical solutions, which are intended for a better understanding of the present invention, and should not be interpreted as limiting the present invention.

In step S01, a substrate 200 is provided.

Figure 3:
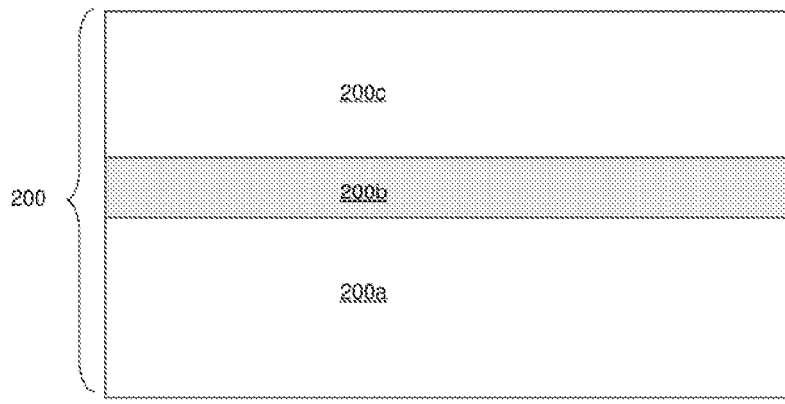
FIG. 3 to FIG. 26 illustrate a method for manufacturing a FinFET according to an embodiment of the present invention with cross-sectional views, including section A-A', section B-B' and section C-C' corresponding to the same top view.

As shown in FIG. 3, in this embodiment, the substrate is a silicon on insulator (SOI) substrate 200, the SOI substrate 200 comprising a back substrate 200a, a buried oxide layer 200b and a topmost silicon layer 200c. In other embodiments, the substrate may have other structures comprising a semiconductor layer and an insulating layer.

Figure 4:
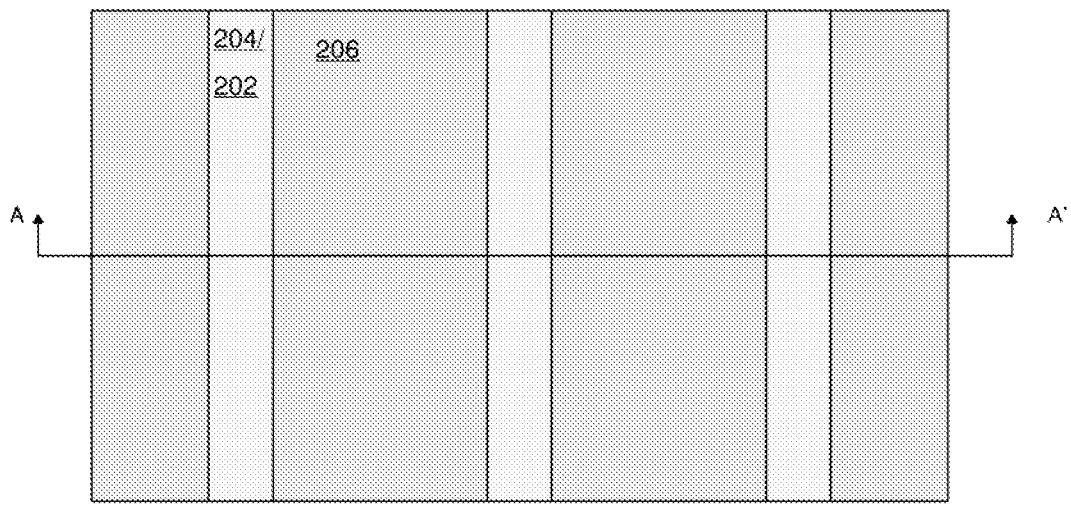
Figure 5:
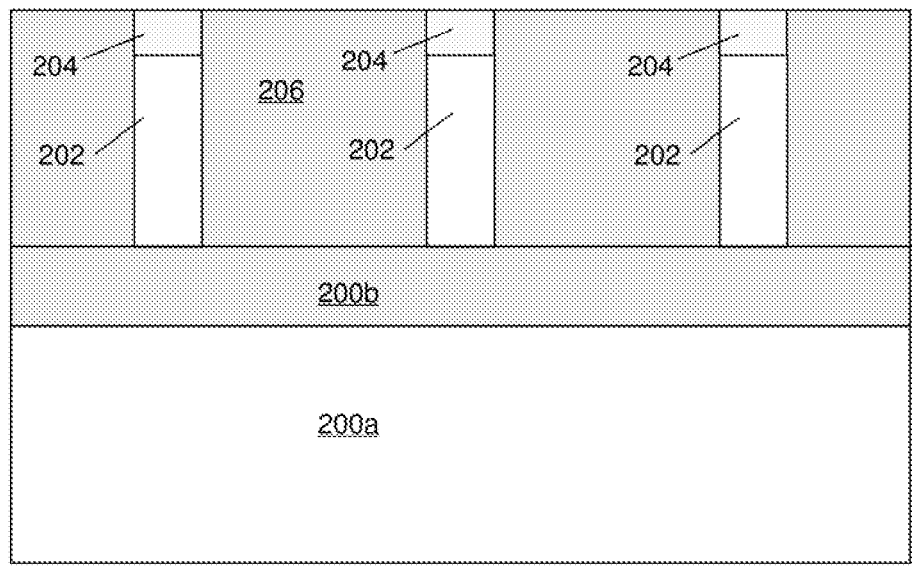

In step S02, a fin 202 is formed in the substrate 200, and a first dielectric layer 206 is formed on the substrate outside the fin 202, as shown in FIG. 4 (top view) and FIG. 5 (section A-A' of FIG. 4).

Specifically, at first, a cap layer 204 may be formed on the topmost silicon layer 200c, then the cap layer 204 is patterned, and the topmost silicon layer 200c is etched by, e.g., reactive-ion etching (RIE), using the cap layer 204 as a hard mask, to form a fin 202 in the topmost silicon layer 200c. Optionally, the cap layer 204 may then be removed, alternatively, the cap layer 204 may be maintained to protect the fin from being affected by subsequent processes. Then, a dielectric such as $SiO_2$ is deposited, and planarized by, e.g., Chemical Mechanical Polishing (CMP), to form a first dielectric layer 206 on the substrate 200b outside the fin 202. In this embodiment, the upper surface of the first dielectric layer is flush with the upper surface of the fin. In other embodiments, the upper surface of the first dielectric layer may not be flush with the upper surface of the fin.

Figure 6:
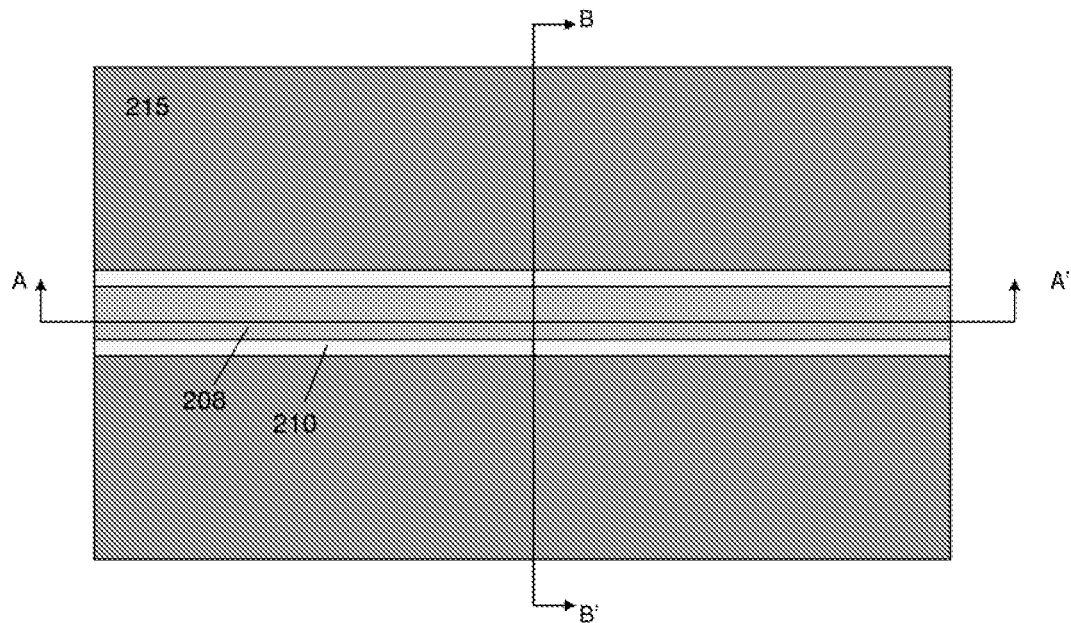
Figure 7:
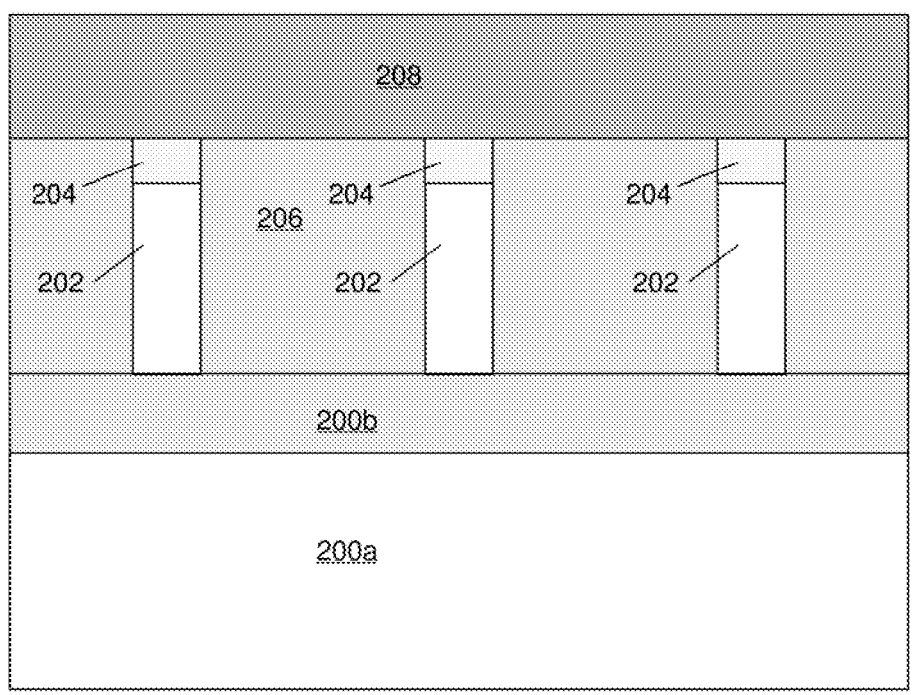
Figure 8:
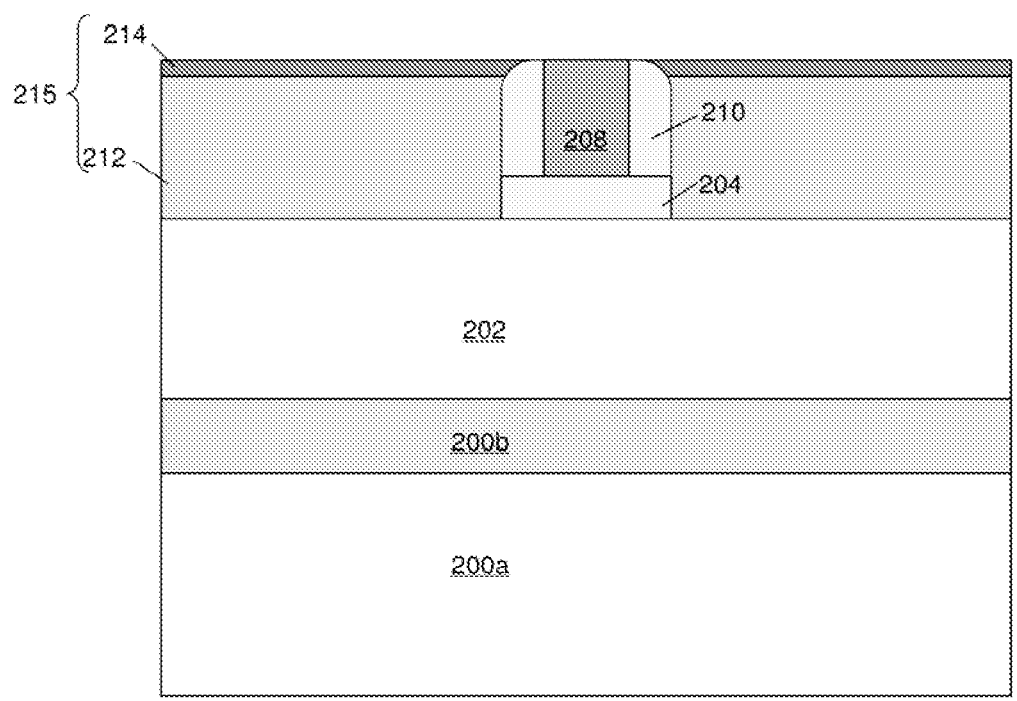

In step S03, a dummy gate 208 across the fin 202 is formed on the first dielectric layer 206 and the fin 202, and a cover layer 215 is formed on the first dielectric layer 206 and the fin 202 outside the dummy gate 208. The upper surface of the cover layer 215 and the upper surface of the dummy gate 208 are in the same plane, as shown in FIG. 6 (top view), FIG. 7 (section A-A' of FIG. 6) and FIG. 8 (section B-B' of FIG. 6).

Specifically, at first, a dummy gate, e.g., polysilicon or other suitable material, is deposited on the device, and patterned, to form a dummy gate 208 across the fin 202. Then, preferably. a spacer may be formed on a side of the dummy gate, specifically, a spacer 210 may be formed on a side of the dummy gate 208 by depositing, e.g., $Si_3N_4$ or other suitable material, and etching. The dummy gate 208 and the spacer 210 may be used as a mask pattern layer in subsequent processes, and the spacer can improve alignment accuracy between the source/drain region and the gate in subsequent processes.

Then, a cover layer 215 is formed, and the cover layer may have a one-layer structure or a multi-layer structure. In this embodiment, preferably, the cover layer 215 has a two-layer structure comprising a second dielectric layer 212 and a third dielectric layer 214, and preferably, the third dielectric layer 214 and the second dielectric layer 212 are made of different dielectrics, alternatively, the third dielectric layer 214, the second dielectric layer 212 and the spacer 210 are all made of different dielectrics. This can facilitate self-alignment and formation of the source/drain region and the gate in subsequent processes, and simplify the procedure. In this embodiment, the cover layer 215 may be formed by depositing a second dielectric layer 212, e.g., $SiO_2$, and the third dielectric layer 214, e.g., a high dielectric constant (high-K) dielectric (e.g., $HfO_2$), and then planarization, e.g., Chemical Mechanical Polishing (CMP), with the dummy gate 208 being a stop layer.

Accordingly, in an embodiment where the cap layer is removed, a cover layer 215 may be formed on the first dielectric layer 206 and the fin 202 outside the dummy gate 208.

Alternatively, in an embodiment where the cap layer is not removed, a dummy gate 208 across the fin may be formed on the first dielectric layer 206 and the cap layer 204, and a cover layer 215 may be formed on the first dielectric layer 206 and the cap layer 204 outside the dummy gate 208, with the upper surface of the cover layer 215 and the upper surface of the dummy gate 208 being in the same plane.

Figure 9:
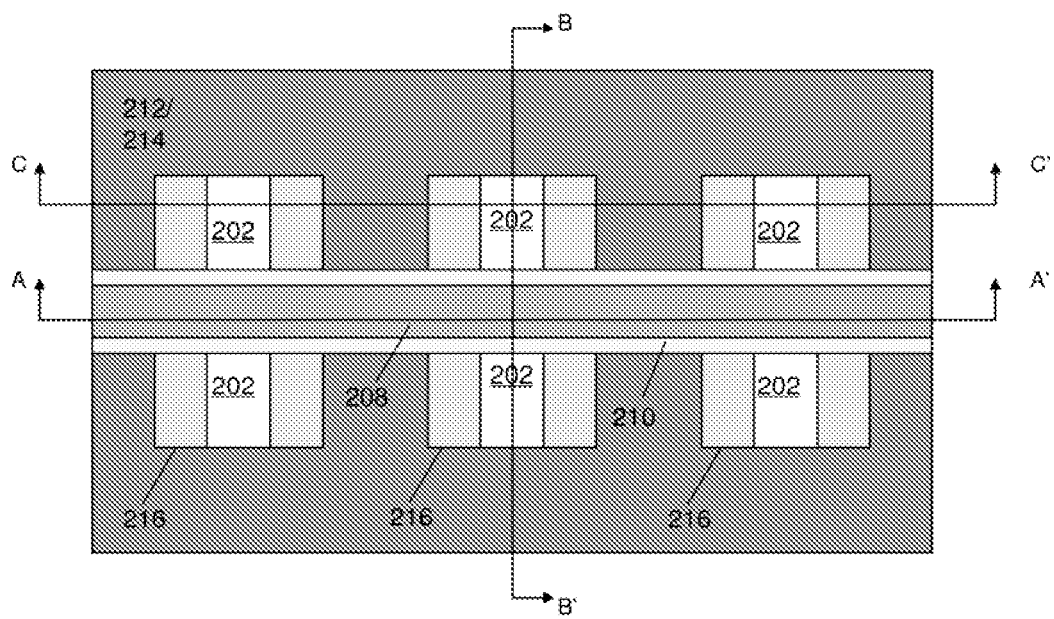
Figure 10:
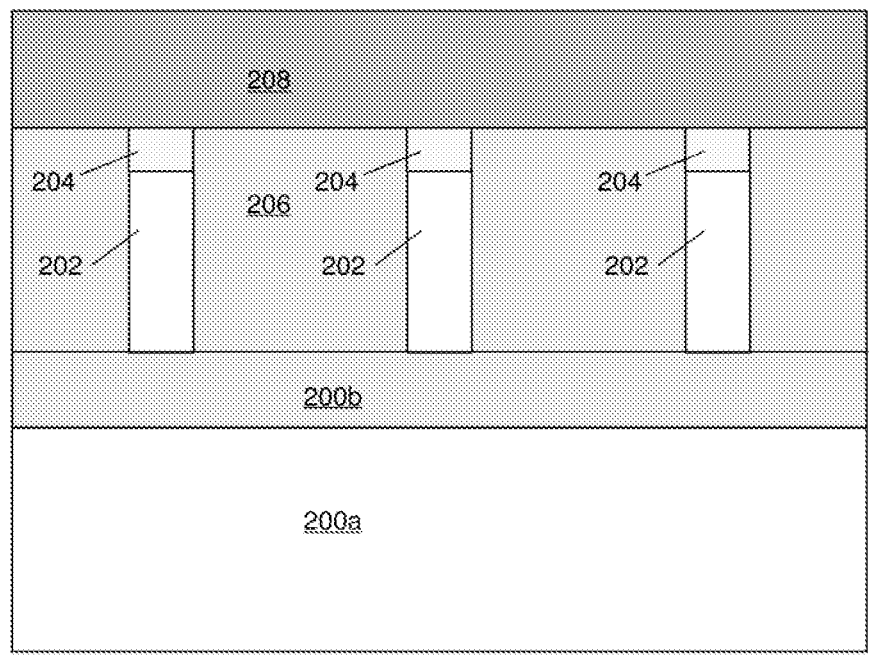
Figure 11:
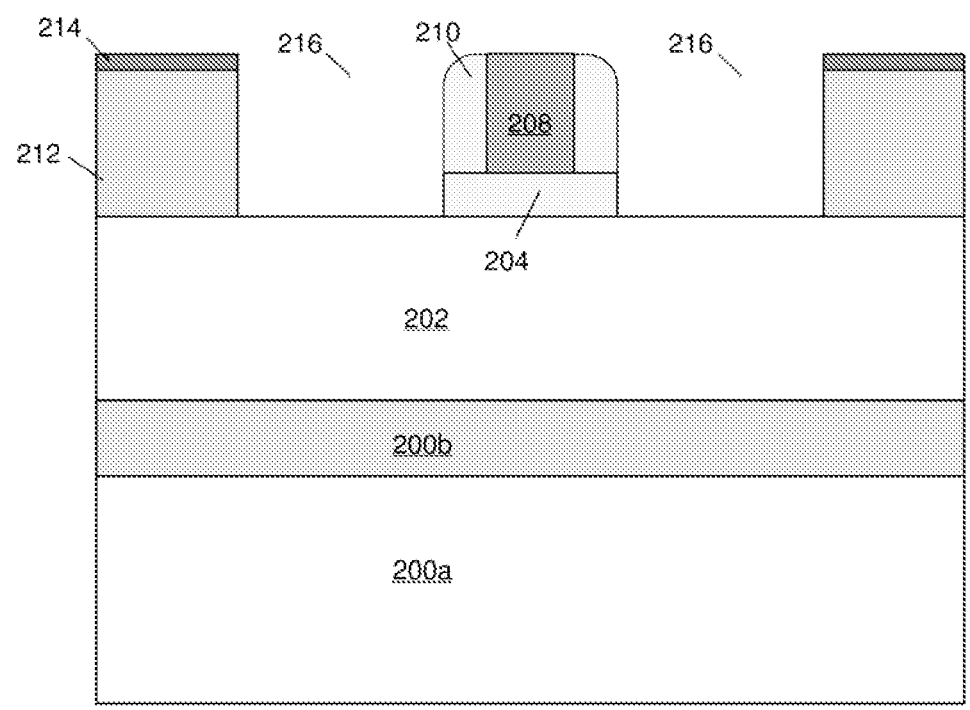
Figure 12:
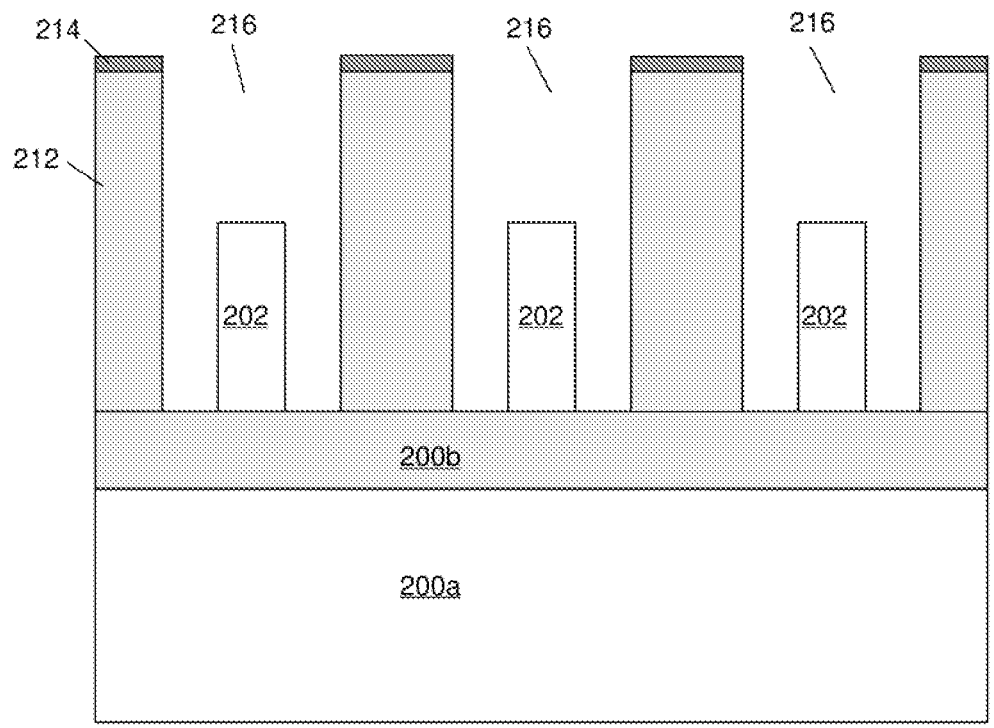

In step S04, part of the cover layer 212 and 214 at both sides of the dummy gate 208, and the first dielectric layer 206 at both sides of the dummy gate 208 are removed, to form a source/drain opening 216 such that the fin 202 at both sides of the dummy gate 208 is exposed in the source/drain opening 216, as shown in FIG. 9 (top view), FIG. 10 (section A-A' of FIG. 9), FIG. II (section B-B' of FIG. 9) and FIG. 12 (section C-C' of FIG. 9).

The part of the cover layer 212 and 214, and the first dielectric layer 206 at both sides of the dummy gate 208, may be removed by etching, e.g., RIE, which stops at the fin 202, to fully expose the fin 202 at both sides of the dummy gate 208, thereby forming the source/drain openings 216.

In the embodiment where the cap layer 204 is not removed, the cap layer 204 on the fin 202 at both sides of the dummy gate 208 may be removed, to fully expose the fin 202 at both sides of the dummy gate 208.

In the present invention, the source/drain opening 216 is at both sides of the fin 202 under the dummy gate 208, the fin 202 under the dummy gate 208 is the substrate where the gate is to be formed, and the source/drain opening 216 at both sides of the fin 202 is an opening region surrounded by the cover layer 212 and 214 and the first dielectric layer 206 around. In the formation of a source/drain region in the source/drain opening, stress is generated due to lattice mismatching, and applied to the channel due to the limitation by the source/drain opening in the first dielectric layer, thereby increasing the carrier mobility of the device, and improving the performance of the device.

Figure 13:
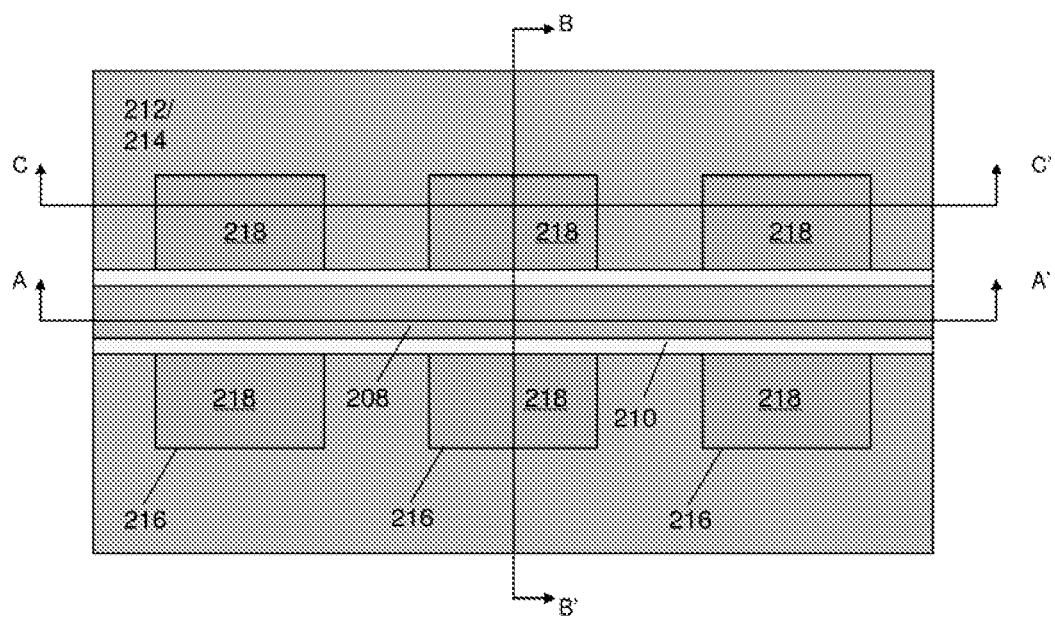
Figure 14:
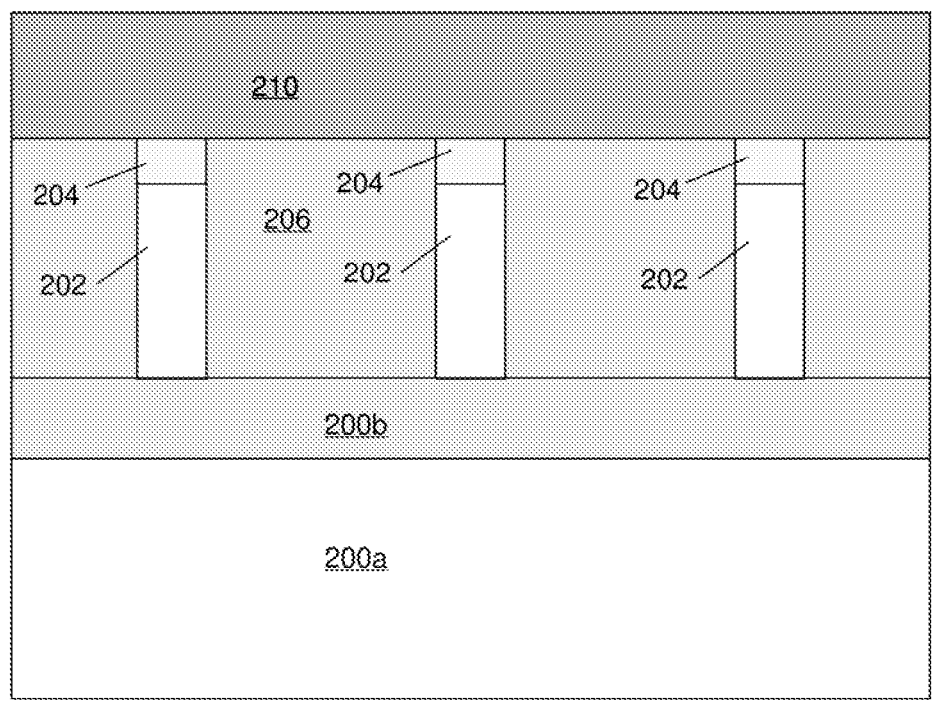
Figure 15:
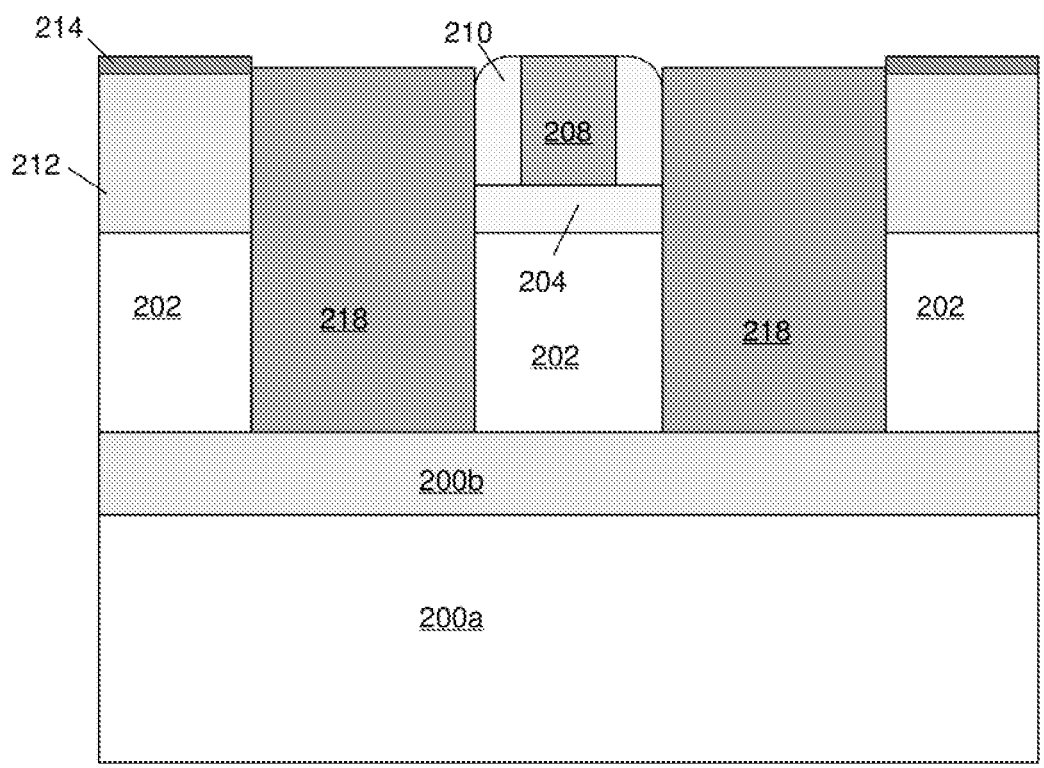
Figure 16:
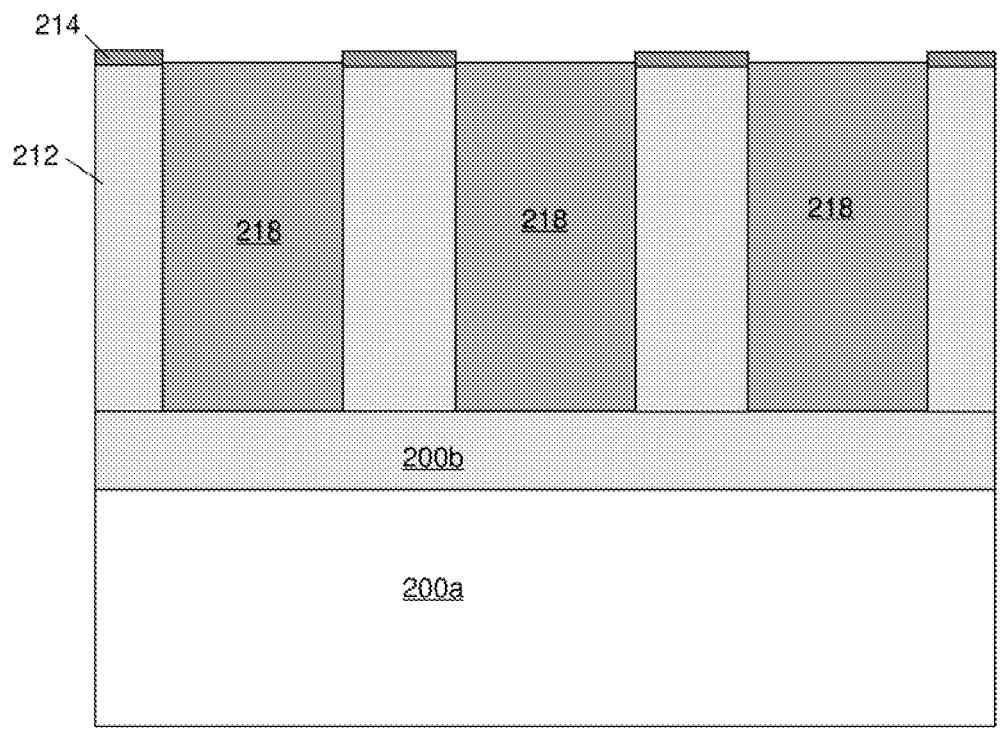

In step S05, the source/drain opening 216 is filled, to form a source/drain region 218 comprising the fin 202 at both sides of the dummy gate 208, as shown in FIG. 13 (a top view), FIG. 14 (an A-A' view of FIG. 13), FIG. 15 (a B-B' view of FIG. 13) and FIG. 16 (a C-C' view of FIG. 13).

In this embodiment, the source/drain opening 216 may be filled by epitaxial growing of an epitaxial layer on the fin 202 at both sides of the dummy gate 208, e.g., SiC in the case of NFET and SiGe in the case of PFET, and then CMP, with the dummy gate 208 being a stop layer, so that a source/drain region 218 is formed by the epitaxial layer together with the fin 202 at both sides of the dummy gate 208. In this embodiment, as the epitaxial layer may diffuse to the fin 202 at both sides of the dummy gate 208, the fin 202 at both sides of the dummy gate 208 may partially or completely turn into the same material as the epitaxial layer (the figure shows the case where it turns completely into the same material as the epitaxial layer). In other embodiments, the source/drain region 218 may be formed in other suitable ways. The source/drain region formed in the source/drain opening is the source/drain region of the eventual device, and stress generated in the process of formation is applied to the channel due to the limitation by the source/drain opening in the first dielectric layer, thereby improving the performance of the device.

Figure 17:
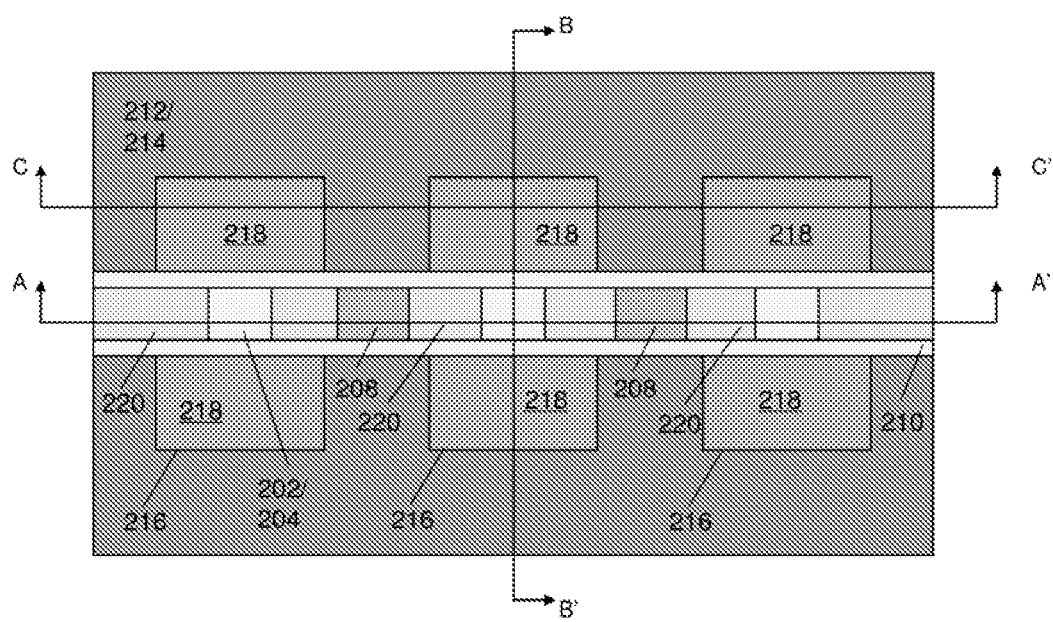
Figure 18:
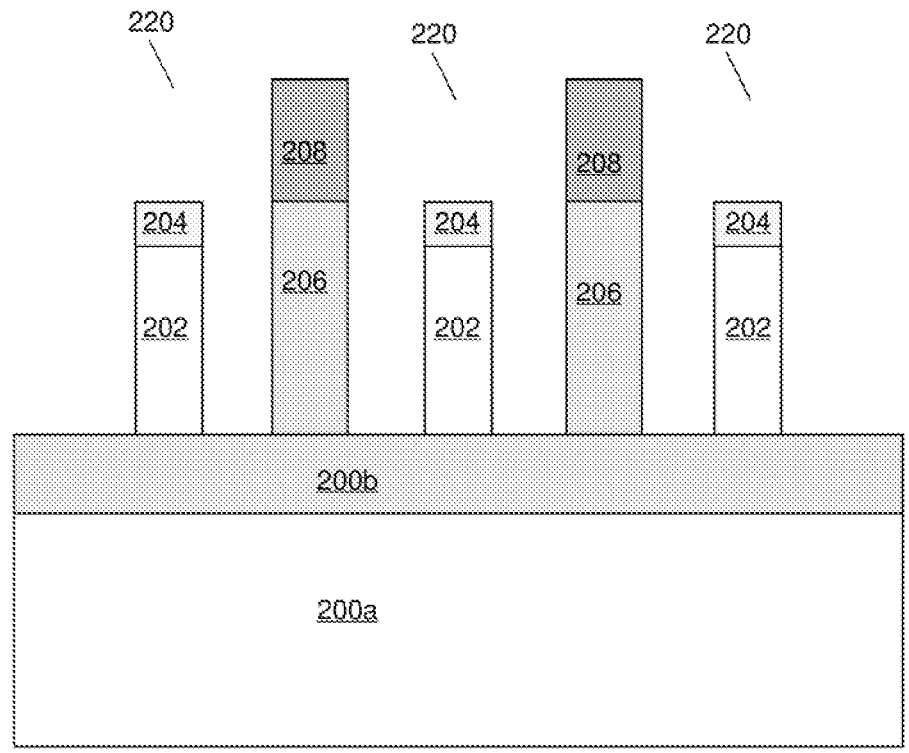
Figure 19:
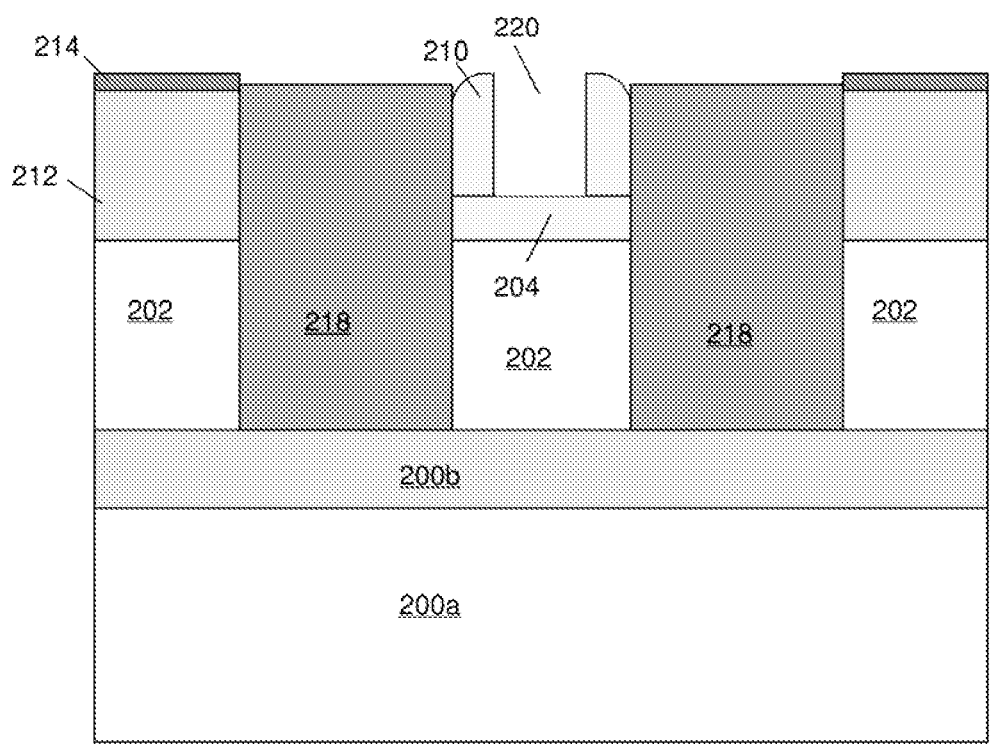
Figure 20:
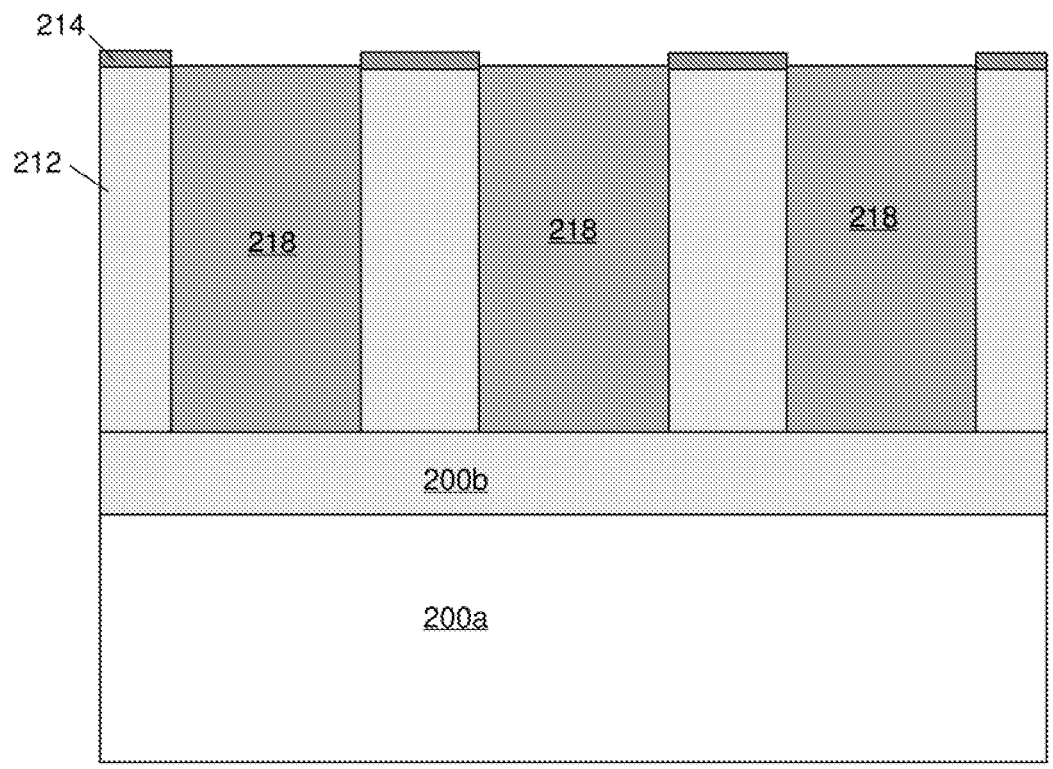

In step S06, part of the dummy gate 208 is removed, and the first dielectric layer 206 under the dummy gate 208 is removed, to form a gate region opening 220 such that the fin 202 under the dummy gate 208 is exposed in the gate region opening 220, as shown in FIG. 17 (top view), FIG. 18 (section A-A' of FIG. 17), FIG. 19 (section B-B' of FIG. 17) and FIG. 20 (section C-C' of FIG. 17).

The dummy gate 208 may be removed by wet or dry etching, then, the first dielectric layer 206 under the dummy gate 208 may be removed, to fully expose the fin 202 or the cap 204 under the dummy gate 208, thereby forming the gate region opening 220. Preferably, in the direction along the fin 202, the edge of the formed gate region opening 220 and the edge of the source/drain region 218 are not aligned to each other, hence, the edge of the gate and the edge of the source/drain region formed subsequently will be jagged, thereby facilitating accurate alignment in subsequent contact plug processes.

Figure 21:
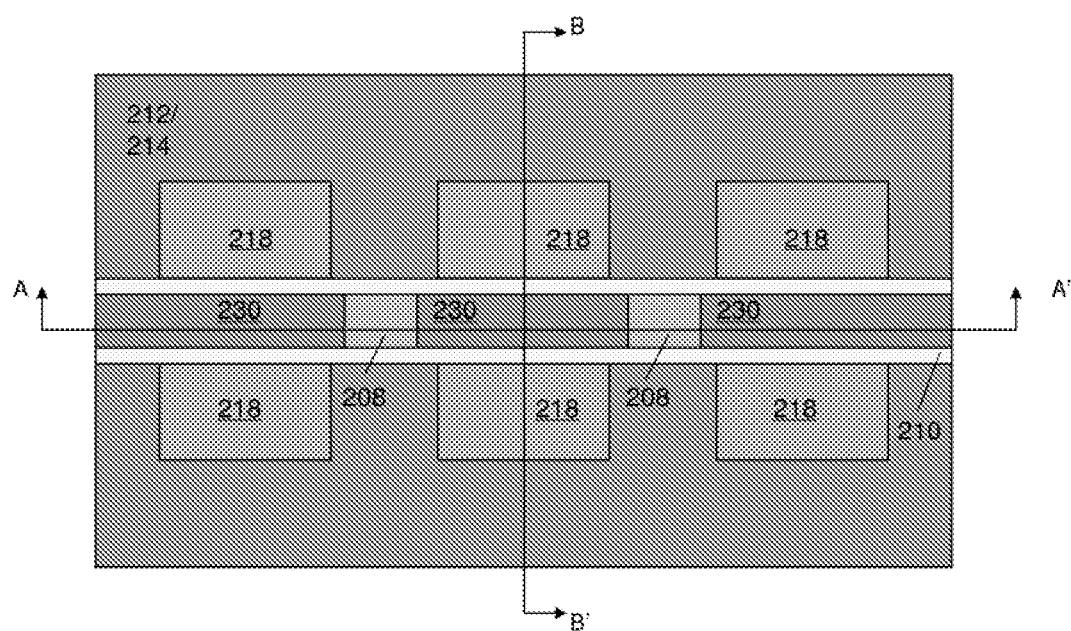
Figure 22:
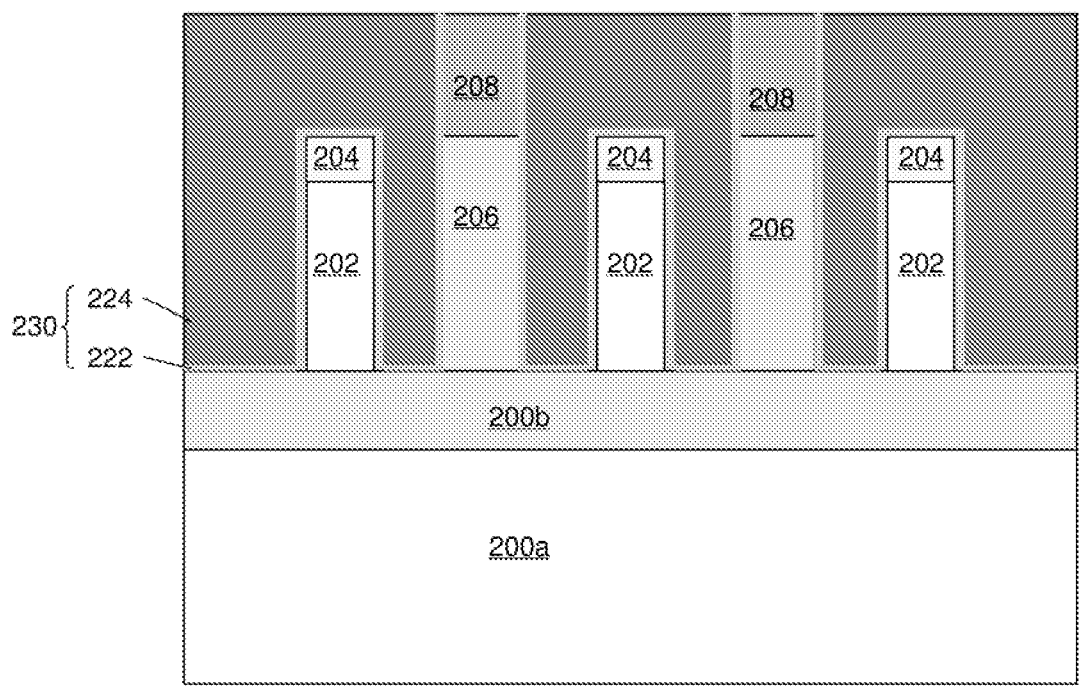
Figure 23:
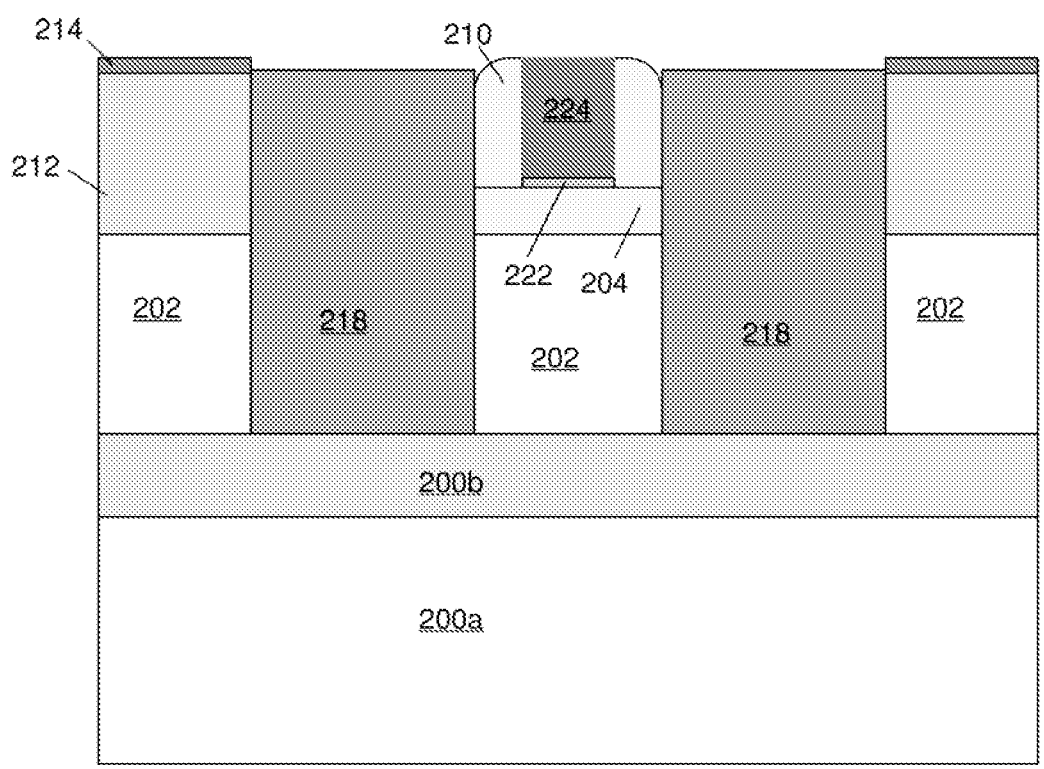

In step S07, the gate region opening 220 is filled up, to form a gate covering the fin 202, as shown in FIG. 21 (top view), FIG. 22 (section A-A' of FIG. 21) and FIG. 23 (section B-B' of FIG. 21) where the gate 230 comprises a gate dielectric layer 222 and a gate electrode 224.

Specifically, at first a gate dielectric layer 222 covering the fin 202 in the gate region opening 220 may be formed, i.e., the gate dielectric layer 222 covers the sidewalls and the top of the fin in the gate region opening. The gate dielectric layer 222 may have a one-layer structure or a multi-layer structure. In some embodiments with a one-layer structure, the gate dielectric layer 222 may be made of a high-K dielectric (e.g., a material having a higher dielectric constant than silicon oxide) or other gate dielectric materials. In some embodiments with a multi-layer structure, the gate dielectric layer 222 may comprise an interface layer and a high-K dielectric layer, with the interface layer being made of, e.g., silicon oxide, silicon nitride. or silicon oxynitride, and the high-K dielectric being. e.g., hafnium oxide, $HFO_2$,SiO, HfSiON, HfTaO or HfTiO, which are provided merely as an example, and should not be interpreted as limiting the invention.

Then, a gate electrode 224 is formed on the gate dielectric layer 222. The gate electrode 224 may have a one-layer structure or a multi-layer structure, and the gate electrode may comprise a metal gate electrode or polysilicon, for example, Ti, $TiAl_x$, TiN, $TaN_x$, HfN, $TiC_x$, $TaC_x$, $HfC_x$, Ru, $TaN_x$, TiAlN, WCN, MoAlN, RuO, polysilicon or other suitable materials, or a combination thereof. In this embodiment, the gate electrode 224 has a one-layer structure, hence metal gate 224. A gate 230 covering the fin 202 may be formed in the gate region opening 220 by depositing, e.g., TiN in the case of NFET and TiCx in the case of PFET, to till up the gate region opening, and then CMP. Hence, the gate is formed on the top and the sidewalls of the fin, and the gate 230 comprises the gate dielectric layer 222 and the metal gate electrode 224. In this embodiment, the upper surface of the gate 230 and the upper surface of the source/drain region 218 are in the same plane, which facilitates accurate alignment of contact plugs in subsequent process. In other embodiments, the upper surface of the gate and the upper surface of the source/drain region may not be in different planes. Here, the structure and the material of the gate are merely an example, and should not be interpreted as limiting the invention.

Thus, a FinFET device with improved stress effect has been formed. Then, according to actual needs, subsequent steps may be performed, e.g., forming a contact plug.

Figure 24:
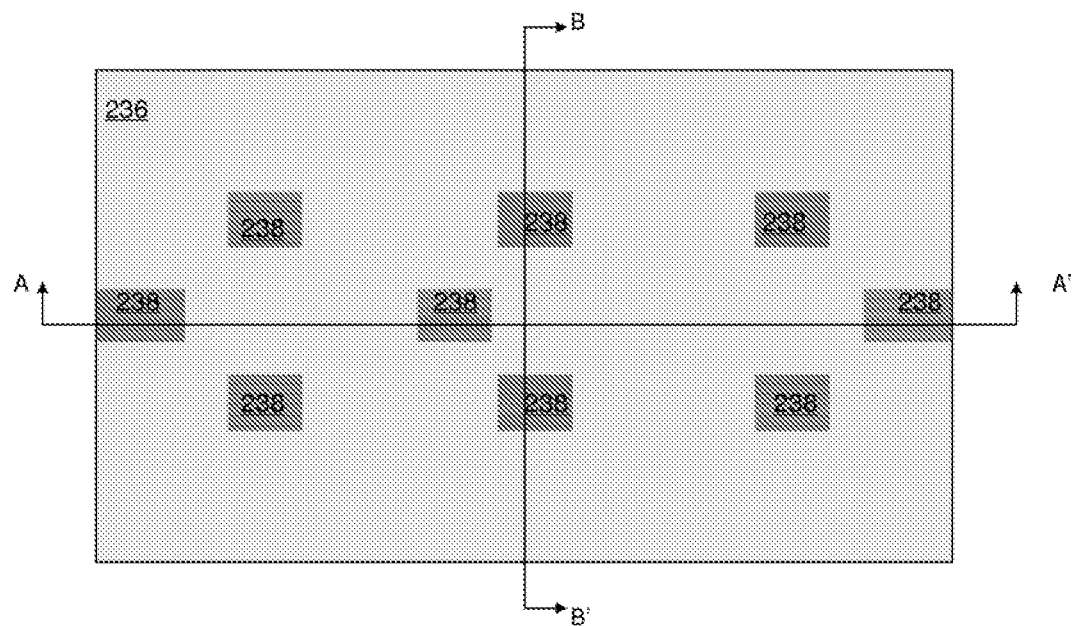
Figure 25:
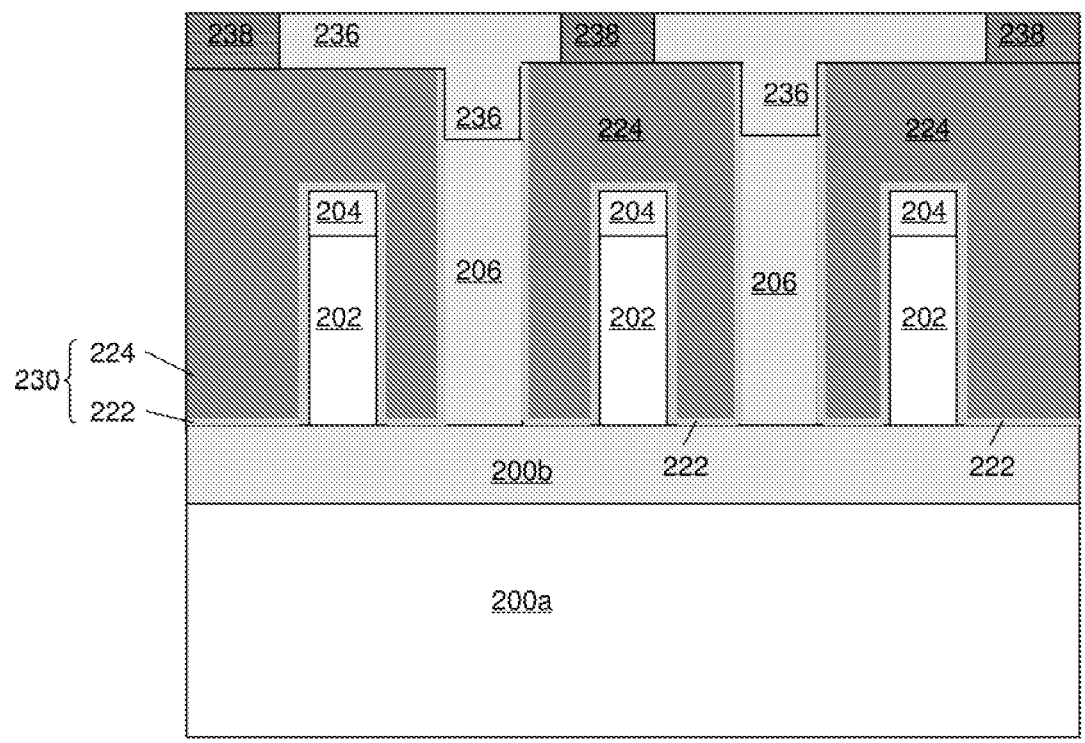
Figure 26:
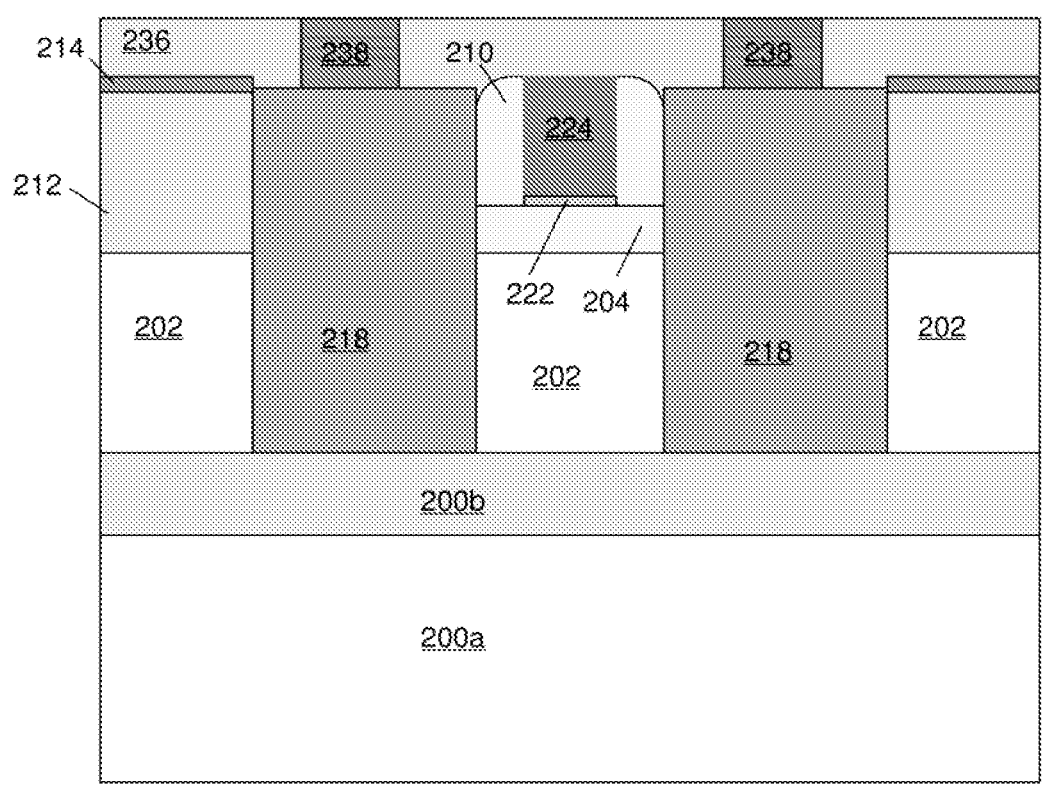

In step S08, a contact plug 238 is formed on the gate 230 and the source/drain region 218, as shown in FIG. 24 (top view), FIG. 25 (section A-A' of FIG. 24) and FIG. 26 (section B-B' of FIG. 24).

Specifically, in this embodiment, at first the remnant dummy gate may be removed, a fourth dielectric layer 236 may be deposited, and planarization may be performed. The fourth dielectric layer 236 fills the space left by the removed remnant dummy gate, and serves as an inter-layer dielectric layer in forming a contact plug.

Then, the fourth dielectric layer 236 may be etched to form a contact hole on the gate 230 and the source/drain region 218. then the contact hole may be filled with metal, e.g., W, to form a contact plug 238. In this embodiment, the gate 230 and the source/drain region 218 are in the same plane, so that alignment of contact plugs can be achieved more easily and accurately. in comparison with a fin-based device in which the gate and the source/drain region are not equal in height.

A method for manufacturing a FinFET according to the invention is described in details above. It is noted that the descriptions above are only preferred embodiments of the present invention, which should not be interpreted as limiting the invention in any form.

Preferred embodiments of the invention are disclosed above, which should not be interpreted as limiting the scope of the invention. Alternations and modifications can be made to the technical solution of the invention by those skilled in the art based on the technical disclosure herein without deviation from the scope of the invention. Therefore, any alternations, equivalents, or modifications made to the embodiments disclosed herein based on the technical essential of the invention without deviation from the scope of the invention should fall within the scope of the invention.

The invention claimed is:

1. A method for manufacturing a Fin Field-Effect Transistor (FinFET), comprising:
   providing a substrate;
   forming a fin on the substrate, and forming a first dielectric layer on the substrate outside the fin;
   forming a dummy gate across the fin on both the first dielectric layer and the fin, and forming a cover layer on the tin and the first dielectric layer outside the dummy gate, wherein upper surfaces of both the cover layer and the dummy gate are in the same plane;
   removing portions of both the cover layer and the first dielectric layer at both sides of the dummy gate, so as to form a source/drain opening such that the fin at both sides of the dummy gate is exposed in the source/drain opening;
   filling the source/drain opening to form a source/drain region comprising the fin at both sides of the dummy gate;
   removing part of the dummy gate and removing the first dielectric layer under the dummy gate, so as to form a gate region opening such that the fin under the dummy gate is exposed in the gate region opening; and
   filling the gate region opening to form a gate covering the fin.

2. The method according to claim 1, wherein the step for forming a source/drain region comprises: filling the source/drain opening by epitaxial growth to form a source/drain region comprising the fin at both sides of the dummy gate.

3. The method according to claim 1, wherein after the step for forming a dummy gate, the method further comprises: forming a spacer on sidewalls of the dummy gate.

4. The method according to claim 1, wherein edges of both the gate and the source/drain region are not aligned in the direction along the fin.

5. The method according to claim 1, wherein the cover layer comprises a second dielectric layer and a third dielectric layer on the second dielectric layer, and the second dielectric layer and the third dielectric layer are made of different dielectrics.

6. The method according to claim 1, wherein after the step for forming a fin, the method further comprises: forming a cap layer on the fin, and further comprises:
   forming a dummy gate across the fin on the first dielectric layer and the cap layer, and forming a cover layer on the first dielectric layer and the cap layer outside the dummy gate, wherein upper surfaces of both the cover layer and the dummy gate are in the same plane; and
   removing the first dielectric layer, the cover layer and the cap layer at both sides of the dummy gate to form a source/drain opening.

7. The method according to claim 1, wherein an upper surface of the first dielectric layer is flushed with that of the fin.

8. The method according to claim 2, wherein the cover layer comprises a second dielectric layer and a third dielectric layer on the second dielectric layer, and the second dielectric layer and the third dielectric layer are made of different dielectrics.

9. The method according to claim 2, wherein after the step for forming a fin, the method further comprises: forming a cap layer on the fin, and further comprises:
   forming a dummy gate across the fin on the first dielectric layer and the cap layer, and forming a cover layer on the first dielectric layer and the cap layer outside the dummy gate, wherein upper surfaces of both the cover layer and the dummy gate are in the same plane; and
   removing the first dielectric layer, the cover layer and the cap layer at both sides of the dummy gate to form a source/drain opening.

10. The method according to claim 2, wherein an upper surface of the first dielectric layer is flushed with that of the fin.

11. The method according to claim 3, wherein the cover layer comprises a second dielectric layer and a third dielectric layer on the second dielectric layer, and the second dielectric layer and the third dielectric layer are made of different dielectrics.

12. The method according to claim 3, wherein after the step for forming a fin, the method further comprises: forming a cap layer on the fin, and further comprises:
   forming a dummy gate across the fin on the first dielectric layer and the cap layer, and forming a cover layer on the first dielectric layer and the cap layer outside the dummy gate, wherein upper surfaces of both the cover layer and the dummy gate are in the same plane; and
   removing the first dielectric layer, the cover layer and the cap layer at both sides of the dummy gate to form a source/drain opening.

13. The method according to claim 3, wherein an upper surface of the first dielectric layer is flushed with that of the fin.

14. The method according to claim 4, wherein the cover layer comprises a second dielectric layer and a third dielectric layer on the second dielectric layer, and the second dielectric layer and the third dielectric layer are made of different dielectrics.

15. The method according to claim 4, wherein after the step for forming a fin, the method further comprises: forming a cap layer on the fin, and further comprises:
   forming a dummy gate across the fin on the first dielectric layer and the cap layer, and forming a cover layer on the first dielectric layer and the cap layer outside the dummy gate, wherein upper surfaces of both the cover layer and the dummy gate are in the same plane; and
   removing the first dielectric layer, the cover layer and the cap layer at both sides of the dummy gate to form a source/drain opening.

16. The method according to claim 4, wherein an upper surface of the first dielectric layer is flushed with that of the fin.

17. The method according to claim 5, wherein the third dielectric layer, the second dielectric layer and the spacer are made of different dielectrics, respectively.

* * * * *